(12) United States Patent
Eng et al.

(10) Patent No.: US 7,553,697 B2
(45) Date of Patent: *Jun. 30, 2009

(54) MULTIPLE CHIP SEMICONDUCTOR PACKAGE

(75) Inventors: Meow Koon Eng, Singapore (SG); Yong Poo Chia, Singapore (SG); Yong Loo Neo, Singapore (SG); Suan Jeung Boon, Singapore (SG); Siu Waf Low, Singapore (SG); Swee Kwang Chua, Singapore (SG); Suangwu Huang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 223 days.

This patent is subject to a terminal disclaimer.

(21) Appl. No.: 11/595,067

(22) Filed: Nov. 9, 2006

(65) Prior Publication Data

US 2007/0059862 A1    Mar. 15, 2007

Related U.S. Application Data

(60) Division of application No. 11/171,124, filed on Jun. 30, 2005, now Pat. No. 7,173,330, which is a continuation of application No. 10/229,908, filed on Aug. 27, 2002, now Pat. No. 6,987,031.

(51) Int. Cl.
*H01L 21/48* (2006.01)
*H01L 21/50* (2006.01)
(52) U.S. Cl. .................... 438/108; 438/126
(58) Field of Classification Search .......... 438/108, 438/126
See application file for complete search history.

(56) References Cited

U.S. PATENT DOCUMENTS

| 5,102,829 | A  | 4/1992  | Cohn         |
|-----------|----|---------|--------------|
| 5,731,227 | A  | 3/1998  | Thomas       |
| 6,150,717 | A  | 11/2000 | Wood et al.  |
| 6,194,250 | B1 | 2/2001  | Melton et al.|
| 6,204,562 | B1 | 3/2001  | Ho et al.    |

(Continued)

*Primary Examiner*—N Drew Richards
*Assistant Examiner*—Pamela E Perkins
(74) *Attorney, Agent, or Firm*—TraskBritt

(57) ABSTRACT

A semiconductor device package and method of fabricating the same are disclosed. The semiconductor device package may include a variety of semiconductor dice, thereby providing a system on a chip solution. The semiconductor dice are attached to connection locations associated with a conductive trace layer such as through flip-chip technology. A plurality of circuit connection elements is also coupled to the conductive trace layer, either directly or through additional, intervening conductive trace layers. An encapsulation layer may be formed over the dice and substrate. Portions of the circuit connection elements remain exposed through the encapsulation layer for connection to external devices. A plurality of conductive bumps may be formed, each conductive bump being disposed atop an exposed portion of a circuit connection element, to facilitate electrical connection with an external device.

16 Claims, 5 Drawing Sheets

U.S. PATENT DOCUMENTS

| | | |
|---|---|---|
| 6,228,687 B1 | 5/2001 | Akram et al. |
| 6,236,109 B1 | 5/2001 | Hsuan et al. |
| 6,239,367 B1 | 5/2001 | Hsuan et al. |
| 6,268,648 B1 | 7/2001 | Fukutomi et al. |
| 6,368,896 B2 | 4/2002 | Farnworth et al. |
| 6,765,299 B2 | 7/2004 | Takahashi et al. |
| 6,815,254 B2 | 11/2004 | Mistry et al. |
| 6,847,109 B2 | 1/2005 | Shim |
| 6,958,537 B2 | 10/2005 | Eng et al. |
| 6,987,031 B2 | 1/2006 | Eng et al. |
| 2002/0027257 A1 | 3/2002 | Kinsman et al. |
| 2002/0164840 A1 | 11/2002 | Lu et al. |
| 2004/0058472 A1 | 3/2004 | Shim |

MULTIPLE CHIP SEMICONDUCTOR PACKAGE

CROSS-REFERENCE TO RELATED APPLICATIONS

This application is a divisional of application Ser. No. 11/171,124, filed Jun. 30, 2005, now U.S. Pat. 7,173,330, issued Feb. 6, 2007, which is a continuation of application Ser. No. 10/229,908, filed Aug. 27, 2002, now U.S. Pat. No. 6,987,031, issued Jan. 17, 2006.

BACKGROUND OF THE INVENTION

1. Field of the Invention

The present invention relates generally to semiconductor packaging. More particularly, the present invention relates to wafer level multichip packaging such as, for example, a system in a package solution.

2. State of the Art

Semiconductor dice (also referred to as chips/dice herein) are found in many electronic products today. As semiconductor dice get smaller and more complex, the problem of making electrical connections between semiconductor dice, connections to carrier substrates such as printed circuit boards, and connections to intermediate substrates such as multichip modules that are, in turn, connected to carrier substrates, has been addressed with a variety of constantly evolving solutions.

One of the earlier solutions included wire bonding from signal connection devices, such as bond pads of a semiconductor die, to pins or leads of a lead frame contained in a ceramic or plastic package. Finished packages are mounted to a carrier substrate, such as a printed circuit board, where the pins or leads make electrical connection with contact pads on the carrier substrate.

The term "signal connection devices" as used herein regarding semiconductor devices includes not only contact pads of a substrate and bond pads of a semiconductor device, but also I/O connections for a semiconductor device created by adding circuitry from bond pads located on the active surface of the semiconductor device to different locations on the active surface of the semiconductor device. Such additional circuitry is typically effected using a so-called "redistribution layer" extending over the active surface or a surface of a semiconductor die.

An evolution of electrical connection technology occurred when multiple semiconductor dice were mounted on an intermediate substrate. In this instance, the semiconductor dice are typically connected to a lead frame by way of bonding wires. Signals, or electrical connections, required for coupling with an external device, such as a circuit board, are brought out to contact pads, pins or leads of the multichip module package. Other signals or electrical interconnections may be established between multiple semiconductor dice by way of circuitry formed on the intermediate substrate.

In these solutions, using wires for connecting a semiconductor die to a substrate and wire bonding processes can create problems. Such problems may include, for example, size and pitch (spacing) requirements for the bond pads of the semiconductor die and contact pads of the substrate; inductance in the signals due to the long curved wires; wire bond breakage and wire sweep causing shorting between adjacent wires; and high signal frequency semiconductor dice making the wire bonding process difficult and expensive.

Flip-chip technologies using solder balls or bumps have helped to alleviate some of these problems. For example, instead of wire bonding, conductive bumps such as, for example, balls of solder may be formed at the locations of the bond pads of a semiconductor die. A specialized lead frame, a dielectric tape carrying circuit traces as used in tape automated bonding processes, or other carrier substrates such as a printed wiring board may have electrical connection locations such as terminals that correspond to the placement of the solder balls on the bond pads of the semiconductor die. The semiconductor die is "flipped" upside down so the solder balls are placed, for example, on the contact pads of a carrier substrate. A solder reflow process heats the solder balls until the solder begins to flow and bond with a corresponding contact pad of a carrier substrate. Upon cooling, the solder forms both mechanical and electrical connections between the carrier substrate and the semiconductor die. This packaging solution may alleviate at least some of the inductance problems, allowing for higher frequency performance and better signal integrity of the semiconductor die. Also, to a certain extent, it allows the contact pads of a substrate where bumps were formed to be larger, more widely pitched and placed anywhere on the semiconductor die active surface rather than just around the periphery or down the center thereof.

Chip scale packaging has evolved from various standard flip-chip processes to a configuration wherein the size of a package is reduced to only slightly larger than the size of the semiconductor die. Chip scale packages are typically created using an interposer substrate. The semiconductor die, with solder balls or bumps such as described above, is attached and electrically connected to the interposer substrate and an encapsulation material is applied over the chip for protection thereof from the elements. The interposer substrate can redistribute signal connections to new locations so they are physically positioned in a desired pattern or arrangement, or to just a different pitch more suitable for mounting to an interposer substrate. An additional set of conductive bumps may then be formed at other contact pad locations on the interposer substrate. The resulting package may then be attached to a carrier substrate such as a printed circuit board.

Chip scale packaging enables small packages using desired ball grid arrays or fine ball grid arrays. However, the interposer substrate is typically made of an organic material that is the same as, or similar to, that used for printed circuit boards. There is conventionally a significant mismatch in the coefficients of thermal expansion (CTE) of the interposer substrate and the semiconductor die, often resulting in substantial stress on the mechanical and electrical interconnections formed between the semiconductor die and interposer substrate (e.g., a reflowed solder connection) during the normal thermal cycling during normal operation of the semiconductor die. The use of a ceramic substrate may alleviate some of the CTE mismatch concerns but at a considerably higher cost relative to more conventional interposer substrates.

Another advance in the area of multichip modules includes wafer scale integration. Wafer scale integration generally comprises fabricating multiple types of functional dice on a single wafer. For example, a four-chip system may be created by placing a microprocessor next to a memory controller and two memory-type semiconductor dice. This pattern may then be repeated across the entire wafer. After fabrication, the wafer is sawed into individual segments with each segment containing the four different functions. However, this approach has not been a very satisfactory solution due to yield problems created by the variations in processes for forming processors and various types of memory-type semiconductor dice. For example, if a defect causes any one of the four functions to be inoperable, the entire segment is defective and not usable.

In addition to that described above, there have been advances in bump technologies where the conductive bumps act as the signal connection device. Conventional solder bumps, in some cases, have been replaced by stud bumps. Stud bumps have conventionally been gold, but copper and plated-type stud bumps have also been used recently. The stud bumps may actually comprise short wires or wire stubs applied to a semiconductor die using a conventional wire bonding process. Stud bumping has the advantages of using a more cost effective wire bonding process for application of the bumps in comparison to the more complex, multistep solder bumping process. Further, conductive and conductor-filled adhesives have also been employed to attach the conductive bumps to a carrier substrate. The conductive or conductor-filled adhesive may provide an amount of flexibility to the mechanical and electrical connection, thereby compensating for some of the problems associated with the mismatch of CTE often associated with solder bump processes as discussed above.

However, in light of the advances made in fabricating semiconductor device packages, there is a continued need for a reliable, cost effective solution with a higher integration of various functional dice in a single package to produce, for example, a system on a chip solution. There is also a need to create smaller packages with more consistent thermal expansion properties while enabling the redistribution of signal connection devices of the various dice to a more convenient, possibly denser, and optionally standard configuration for attachment to a carrier substrate, the redistribution layers also enabling higher frequency signal performance.

Finally, it would be advantageous to provide a system on a chip packaging solution using known good dice, such use thereby increasing the yield of usable packages and, thus, improving the efficiency and cost effectiveness associated with producing such packages.

BRIEF SUMMARY OF THE INVENTION

The present invention provides a multichip multilayer system on a chip solution. Greater integration is accomplished using a plurality and variety of known good dice applied in a flip-chip configuration to a silicon substrate containing at least one circuit redistribution layer. This allows the use of manufacturing processes and geometries for silicon for creating the redistribution and interconnect layers for the multichip configuration.

The redistribution layers may be terminated with conductive bumps, perhaps in a standard configuration, at the top layer such that the multichip package may be used in a typical flip-chip application to a carrier substrate such as a printed wiring board or other multichip module.

In accordance with one aspect of the invention, a substrate, such as a silicon wafer, is coated with a layer of dielectric material. A first conductive trace layer is deposited and patterned atop the dielectric layer. Circuit connection elements, such as metal columns, are formed upon the first conductive trace layer at various locations. Conductive bumps are formed on the circuit connection elements to provide interconnection with an external device such as a carrier substrate.

A plurality of additional conductive trace layers may be formed for signal redistribution purposes. Once the desired number of conductive trace layers is formed, a final dielectric layer is formed over the last of the conductive trace layers.

Vias, or holes, are formed in the final dielectric layer to accommodate connection of the conductive trace layers with the signal device connections of the semiconductor dice. The various semiconductor dice may be attached, for example, in a flip-chip configuration with the active area of the dice facing the final dielectric layer and the signal device connections on the dice positioned in the holes and contacting the underlying conductive trace layer.

The entire assembly may then be covered with an encapsulation layer covering the various dice and the top dielectric layer to protect them from the elements. However, the encapsulation layer is configured so that portions of the circuit connection elements are exposed therethrough. Conductive bumps may then be applied to the exposed portions of the circuit connection elements, thereby providing an external connection mechanism for electrical interconnection with, for example, a carrier substrate or another multichip module.

Multiple semiconductor device packages may be formed on a silicon wafer with each package functioning as a system on a chip module. Each individual package may be tested through appropriate electrical connection with the conductive bumps prior to the packages being singulated.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
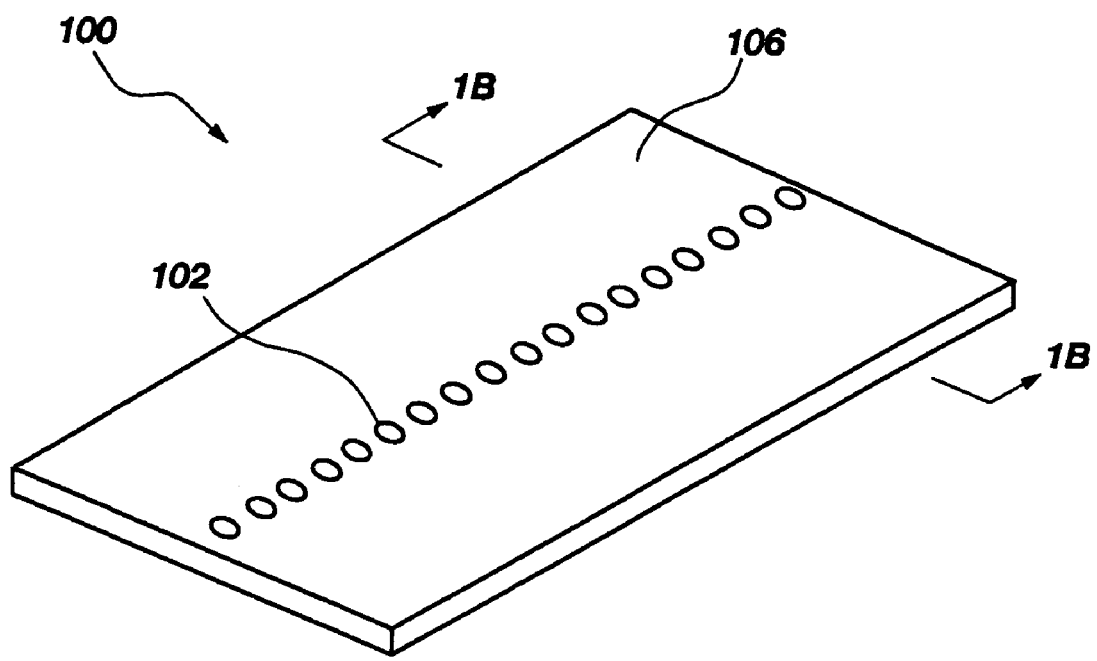
FIGS. 1A and 1B show a perspective view and a cross-sectional view, respectively, of an exemplary semiconductor die that may be used in conjunction with various embodiments of the present invention.
Figure 1B:
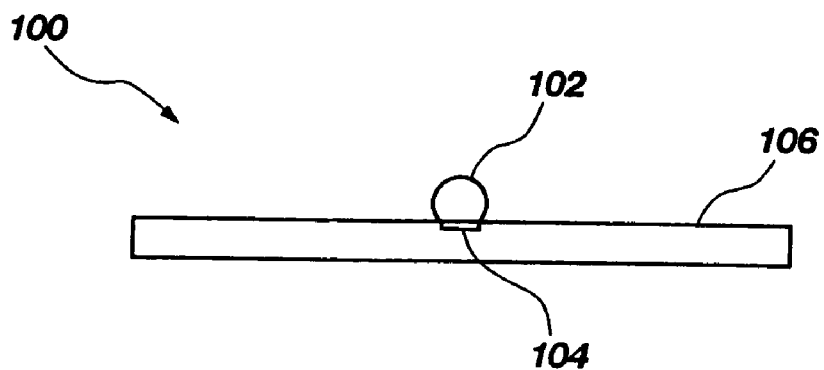

Referring first to drawing FIGS. 1A and 1B, an exemplary semiconductor die 100 that may be utilized in conjunction with the present invention is shown. The semiconductor die 100 includes internal circuitry (not shown) that is coupled to a plurality of signal device connections shown in the form of conductive bumps 102 electrically coupled with bond pads 104 that are formed on an active surface 106 of the die. It is noted that the semiconductor die 100 may exhibit a configuration that is different from that depicted in drawing FIGS. 1A and 1B as will be appreciated by those of ordinary skill in the art. For example, while the conductive bumps 102 are generally shown as spherical balls, such may actually be formed in other shapes such as, for example, stud bumps or columnar members. Furthermore, while the semiconductor die 100 is shown to have only a single row of conductive bumps 102 that extend longitudinally along the active surface 106 thereof, varying arrangements of the conductive bumps 102 may be employed, which might include, for example, an arrangement of conductive bumps 102 around the periphery of the active surface 106 or an array of conductive bumps across the field of the active surface 106.

Referring now to drawing FIGS. 2A through 2F, the process of fabricating a semiconductor device package according to an embodiment of the present invention is shown. Referring first to drawing FIG. 2A, a substrate 110, such as, for example, a silicon wafer, is coated with a layer of dielectric material generally referred to herein as a first dielectric layer 112. A first conductive trace layer 114, which may also be referred to as a redistribution layer, is formed over the first dielectric layer 112. The first conductive trace layer 114 may be formed using a conventional metal deposition and patterning process to create a desired configuration of metal interconnect lines.

Figure 2A:
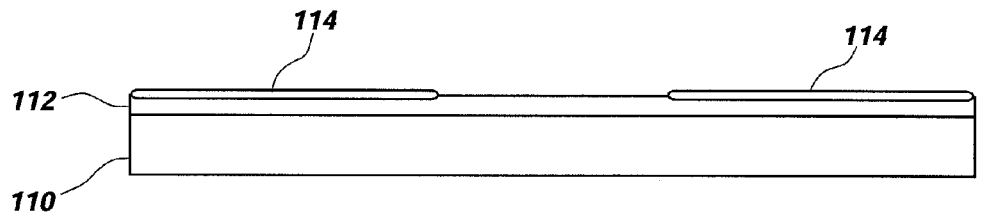
FIGS. 2A-2F show cross-sectional views of a semiconductor device package according to an embodiment of the present invention at various stages of fabrication.
Figure 2B:
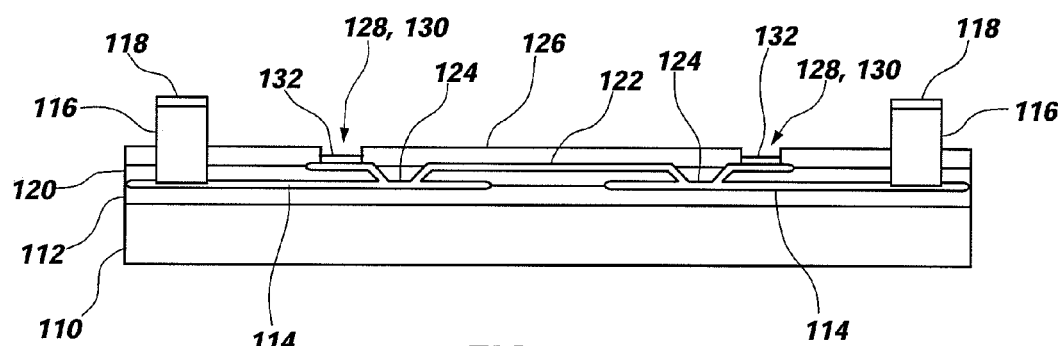

As shown in drawing FIG. 2B, circuit connection elements 116 are electrically coupled to the first conductive trace layer 114 at various locations. The circuit connection elements 116 may be configured and arranged for electrical connection with an external device as shall be discussed in greater detail below. While the circuit connection elements 116 are generally depicted as conductive columns, other configurations may be utilized without departing from the spirit and scope of the invention. Such circuit connection elements 116 may be formed of, for example, solder, gold or other metallic compositions. The top surface of the circuit connection elements 116 may be plated with a UBM layer 118, the UBM layer typically being an alloy or combination of different metals, to improve adhesion between the circuit connection elements 116 and additional electrical connection members as will be described in further detail below.

Still referring to drawing FIG. 2B, a second dielectric layer 120 is formed over the first conductive trace layer 114 and first dielectric layer 112. A second conductive trace layer 122 is then formed over the second dielectric layer 120 and is electrically coupled to the first conductive trace layer 114. The first and second conductive trace layers 114 and 122 may be coupled by forming a plurality of vias in the second dielectric layer 120, thereby exposing a plurality of connection areas 124 associated with the first conductive trace layer 114. The second conductive trace layer 122 may then contact the first conductive trace layer 114 through the plurality of connection areas 124.

If desired, a predetermined number of additional circuit redistribution layers may be formed by disposing, in a laminar fashion, additional dielectric layers and conductive trace layers over existing layers and electrically coupling each new conductive trace layer with an adjacent underlying conductive trace layer. Thus, while only one additional circuit redistribution layer is shown in drawing FIGS. 2B-2F, the process of forming additional redistribution layers may be repeated a desired number of times to form multiple redistribution layers. Multiple circuit redistribution layers may be desired to create power planes, ground planes, and/or difficult signal interconnections not easily accomplished on only one or two layers. It is further noted that, in some embodiments, no additional circuit redistribution layers may be required. Thus, only the first conductive trace layer 114 may be required, as will be recognized and appreciated by those of ordinary skill in the art.

A final dielectric layer 126 is formed over the second conductive trace layer 122 and second dielectric layer 120 (or the outermost circuit connection layer if additional circuit connection layers are utilized). A plurality of vias 128 is formed in the final dielectric layer 126, such as through a conventional etching process, to expose the second conductive trace layer 122, creating a plurality of exposed connection areas 130 associated with the second conductive trace layer 122.

The vias 128 are sized, arranged and configured to cooperatively mate with the plurality of conductive bumps 102 of a plurality of semiconductor dice 100 (FIGS. 1A and 1B). A metallization layer 132, such as a conventional under bump metallization (UBM) layer, may be formed over each of the exposed connection areas 130 of the second conductive trace layer 122. The metallization layer 132 is formed of a metallic composition that helps to improve electrical and mechanical contact between the exposed connection areas 130 of the second conductive trace layer 122 and, for example, the conductive bumps 102 of the semiconductor die 100 (FIGS. 1A and 1B). An exemplary UBM layer may include alloys of various metals, such as nickel-gold alloys, titanium-nickel-gold alloys, etc.

Figure 2C:
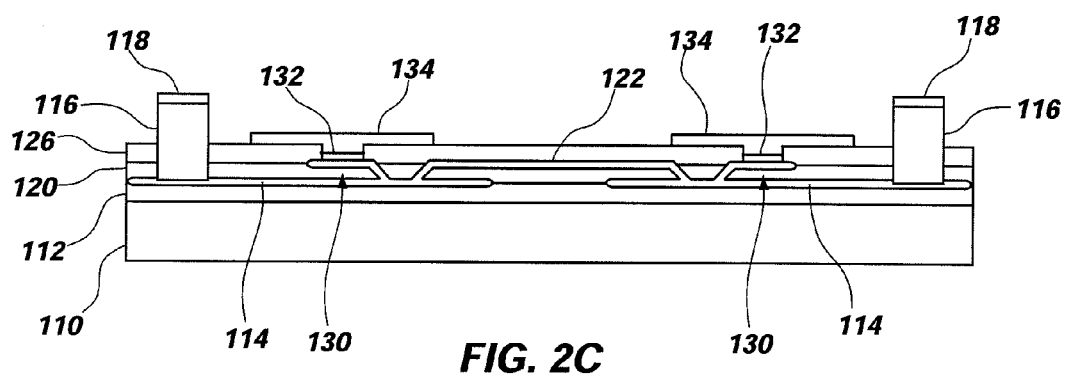

Referring to drawing FIG. 2C, in accordance with one embodiment of the present invention, an attachment layer 134 may be formed over a portion of the final dielectric layer 126 and over the metallization layer 132 formed on each exposed connection area 130 of the second conductive trace layer 122. In another embodiment, the attachment layer 134 might be formed to cover the entire surface of the final dielectric layer 126. The attachment layer 134 may be formed of, for example, anisotropic conductive film, anisotropic conductive paste, nonconductive film or nonconductive paste.

Figure 2D:
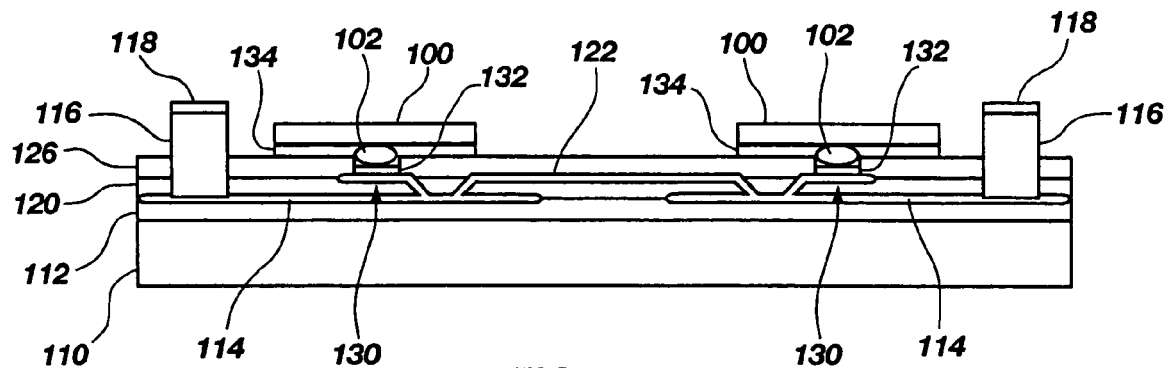

Next, as shown in drawing FIG. 2D, a plurality of semiconductor dice 100, such as those shown in drawing FIGS. 1A and 1B, may be attached in a flip-chip configuration to the substrate 110 and its associated layers, with the conductive bumps 102 being aligned with the plurality of exposed connection areas 130 of the second conductive trace layer 122. After placement of the semiconductor dice 100, the attachment layer 134 is cured, thereby forming a reliable electrical and mechanical bond.

The electrical connection mechanism is somewhat different depending on whether anisotropic or nonconductive material is used. When anisotropic materials are used to form the attachment layer 134, the unidirectional conductive properties of the material provide for electrical conduction along an axis between the conductive bumps 102 and the metallization layer 132 while preventing conduction in a direction that is substantially transverse thereto.

On the other hand, if a nonconductive adhesive is used to form the attachment layer 134, the conductive bumps 102 are pulled firmly against the metallization layer 132 due to the reduction of volume or the shrinking of the attachment layer 134 during curing, resulting in a secure electrical connection therebetween.

When using an attachment layer 134 comprising either an anisotropic or nonconductive material, the conductive bumps 102 may comprise, for example, gold, copper or other plated-type alloys. As noted above, regardless of whether anisotropic or nonconductive material is used, the attachment layer 134 also provides a firm mechanical bond between the final dielectric layer 126 and the semiconductor dice 100.

If the conductive bumps 102 are formed as solder-type connections, the process of forming an electrical interconnection between the semiconductor die 100 and substrate 110 may be accomplished by reflowing the solder material such as with controlled collapse chip connect (C4) technology. Additionally, if the conductive bumps 102 are formed as solder-type connections, an underfill material may be used in place of the attachment layer 134 to fill the space between the active surface 106 of the semiconductor dice 100 and the final dielectric layer 126. The underfill material helps to protect the signal connection devices from the surrounding environment and, in some cases, reduces stress that may be generated in the resulting soldered connections due to a mismatch of coefficients of thermal expansion between the semiconductor die 100 and the substrate 110 with its various layers.

Figure 2E:
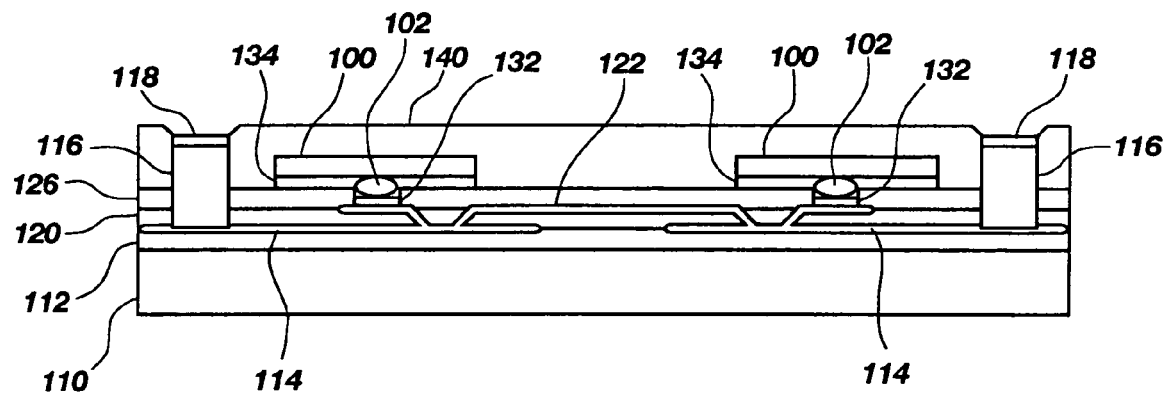

Referring now to drawing FIG. 2E, with the semiconductor dice 100 being electrically coupled to the second conductive trace layer 122, an encapsulation layer 140 may be applied over the semiconductor dice 100 as well as the final dielectric layer 126 to protect them from the surrounding environment. A portion of the circuit connection elements 116 including the UBM layer 118 remains exposed through the encapsulation layer 140.

Figure 2F:
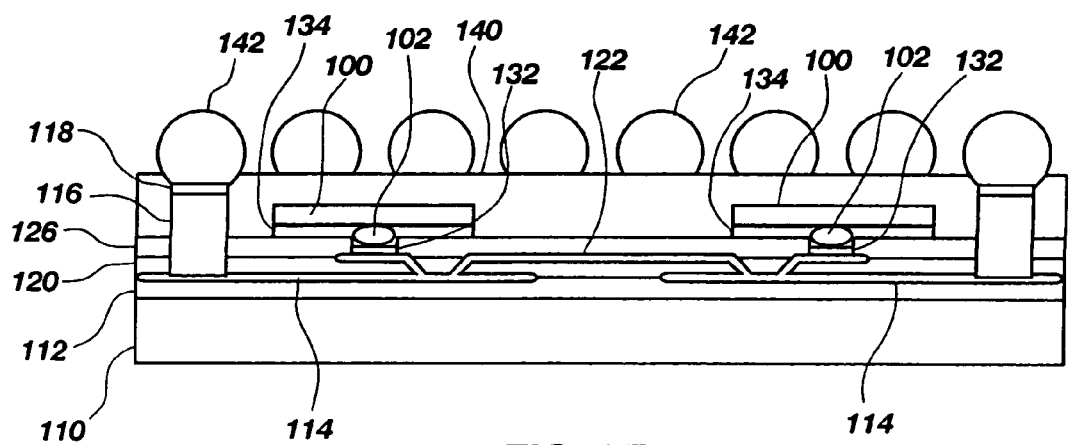

Referring now to drawing FIG. 2F, a plurality of conductive bumps 142 may be formed with each conductive bump 142 being disposed on, and electrically coupled to, the exposed portion of a respective circuit connection element 116. The conductive bumps 142 may be formed as, for example, solder bumps or stud bumps comprised of gold, copper, or other plated-type alloys. With the conductive bumps 142 formed, testing of the resulting semiconductor device package may be conducted through appropriate electrical connection with the conductive bumps 142. It is noted, however, that testing might occur at other stages of fabrication as well as through appropriate electrical connection with the circuit connection elements 116 prior to formation of the conductive bumps 142.

Figure 3:
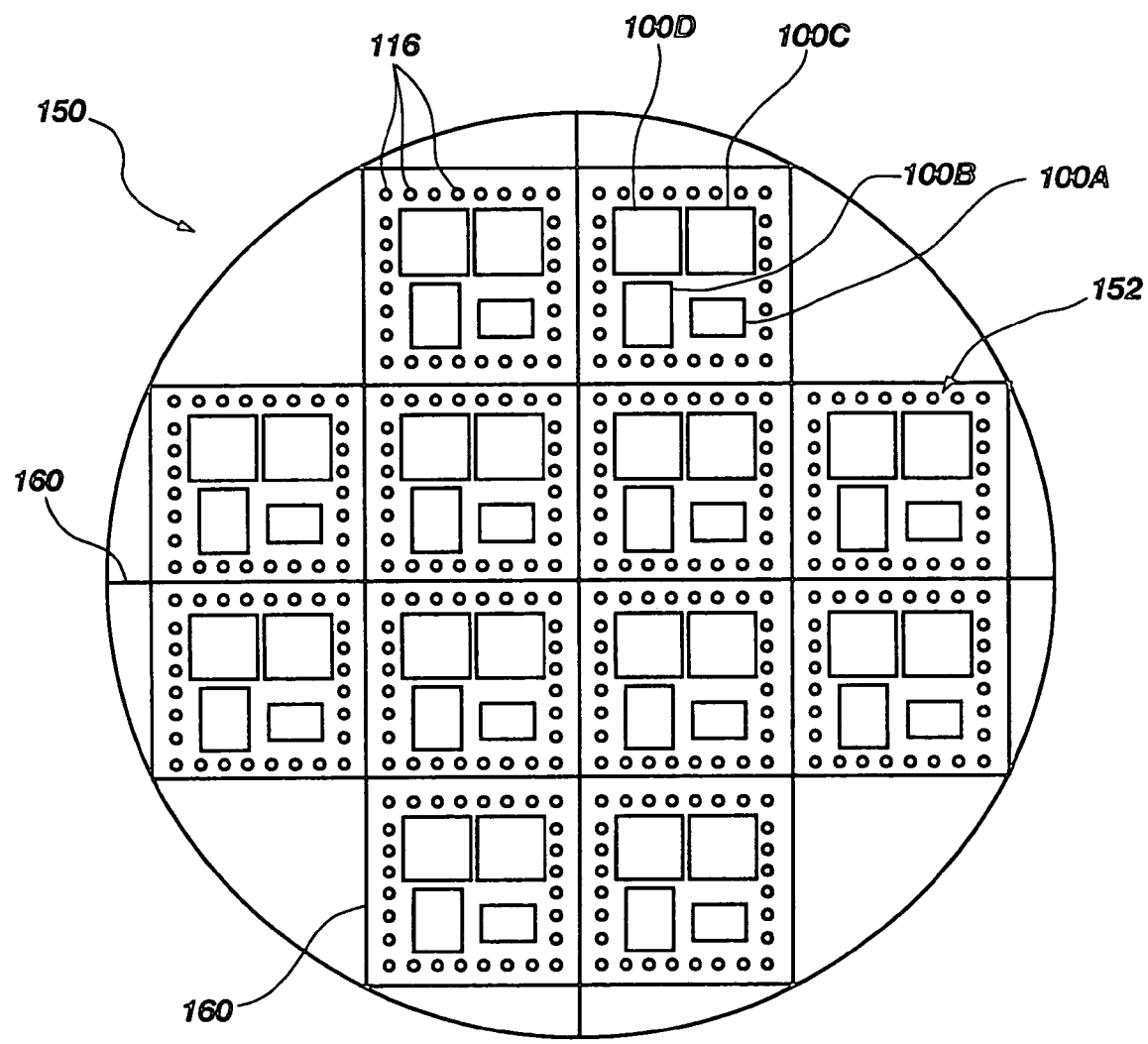
FIG. 3 is a plan view showing a substrate having a plurality of semiconductor device packages formed thereon according to an embodiment of the invention.

Referring now to drawing FIG. 3, a wafer assembly 150 is shown having a plurality of semiconductor device packages 152 according to an embodiment of the present invention. It is noted that the semiconductor device packages 152 are shown without the encapsulation layer for purposes of clarity. Each semiconductor device package 152 may include a plurality of semiconductor dice 100A-100D. The wafer assembly 150 is sawed into individual segments along sawing lines 160 to form the individual semiconductor device packages 152. Having multiple semiconductor dice 100A-100D in each semiconductor device package 152, each individual semiconductor device package may function as a system on a chip module. For example, semiconductor die 100A might be a processor, semiconductor die 100B might be a memory controller and semiconductor dice 100C and 100D might be memory chips. Although FIG. 3 shows a semiconductor device package 152 containing four semiconductor dice 100A-100D, it should be understood that the number of dice within a semiconductor device package 152 might be some other number depending on the design and intended use thereof. It is further noted that while the circuit connection elements 116 have been shown to be located and arranged generally adjacent the periphery of the semiconductor device package 152, other arrangements and configurations may be used as will be appreciated by those of ordinary skill in the art.

Figure 4:
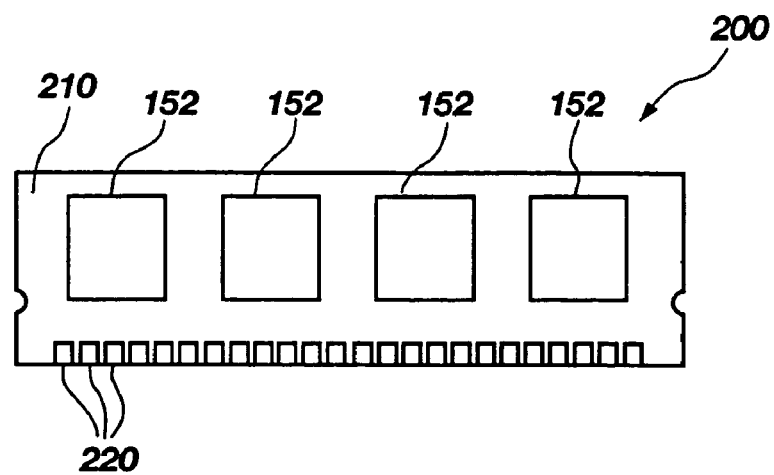
FIG. 4 is a plan view showing a memory device including a multichip semiconductor device package according to an embodiment of the present invention.

Referring now to drawing FIG. 4, a memory device 200, also referred to as a memory module, is shown, which incorporates at least one semiconductor device package 152 according to the present invention. The memory device 200 includes a carrier substrate 210, such as a printed circuit board, to which one or more semiconductor device packages 152 may be electrically and operably coupled. A plurality of electrical connectors 220 is formed on the carrier substrate 210 to provide input and output connections from an external device, such as, for example, the motherboard of a computer, to the one or more semiconductor device packages 152.

Figure 5:
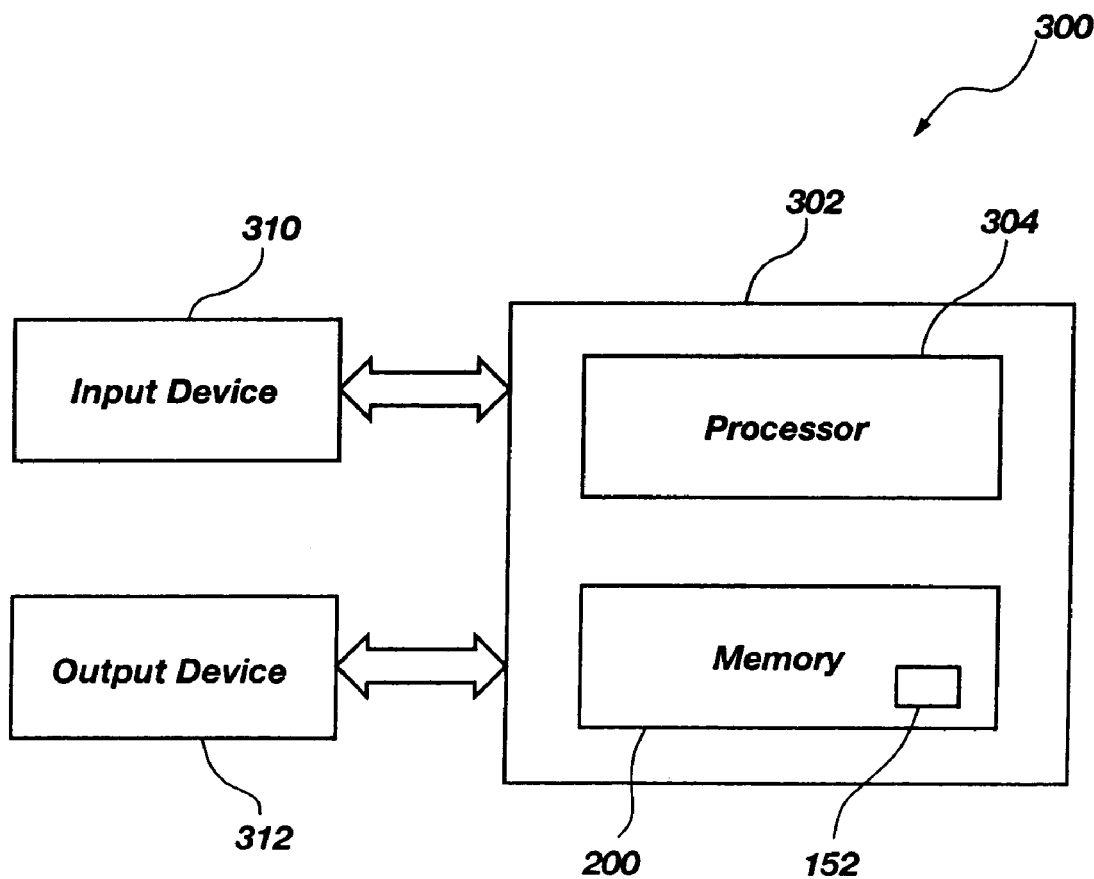
FIG. 5 is a block diagram of a computing system including a multichip semiconductor device package according to an embodiment of the present invention.

Referring now to drawing FIG. 5, a computing system 300 is shown, which includes a carrier substrate 302 such as, for example, a motherboard. The carrier substrate 302 may be operably coupled to at least one processor 304, such as, for example, a central processing unit (CPU) and at least one memory device 200. The memory device 200 may include one or more semiconductor device packages 152 such as described above. The carrier substrate 302 is operably coupled with at least one input device 310 such as, for example, a keyboard, a mouse, a sensor or another computing device. The carrier substrate 302 is also operably coupled with at least one output device 312 such as, for example, a printer, a monitor, an actuator or another computing device. Alternatively, the packaged multichip semiconductor device package 152 may be coupled directly with the carrier substrate 302.

Specific embodiments have been shown by way of example in the drawings and have been described in detail herein; however, the invention may be susceptible to various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A method of manufacturing a semiconductor device package using a substrate having a surface, comprising:
    forming a first dielectric layer on the surface of the substrate;
    forming a conductive trace layer on the first dielectric layer;
    forming a plurality of circuit connection elements and electrically coupling each circuit connection element of the plurality to the conductive trace layer;
    forming a second dielectric layer over the conductive trace layer; and
    forming a plurality of vias in the second dielectric layer exposing a plurality of connection areas on the conductive trace layer, the plurality of connection areas configured for receiving a plurality of semiconductor dice.

2. The method of claim 1, further comprising:
    providing the plurality of semiconductor dice, each semiconductor die of the plurality having a plurality of signal connection devices; and
    electrically coupling the plurality of signal connection devices of each of the plurality of semiconductor dice with the plurality of connection areas on the conductive trace layer.

3. The method of claim 2, wherein electrically coupling the plurality of signal connection devices further comprises forming a metallization layer on the plurality of connection areas on the conductive trace layer.

4. The method of claim 1, further comprising depositing a barrier metal layer on each of the plurality of circuit connection elements.

5. The method of claim 4, further comprising forming a plurality of conductive bumps wherein each conductive bump of the plurality is disposed on the barrier metal layer of each of the plurality of circuit connection elements.

6. The method of claim 5, wherein forming the plurality of conductive bumps further comprises forming the plurality of conductive bumps to comprise at least one of the group consisting of solder bumps, gold stud bumps, copper stud bumps, and plated alloy stud bumps.

7. The method of claim 1, further comprising singulating the substrate into a plurality of multichip packages wherein each multichip package of the plurality includes at least two semiconductor dice.

8. The method of claim 7, further comprising arranging the plurality of semiconductor dice such that the at least two semiconductor dice of each multichip package are of at least two functional varieties.

9. A method of manufacturing a semiconductor device package, comprising:
provided a substrate having a surface;
forming a first dielectric layer on the surface;
forming a conductive trace layer on the first dielectric layer;
forming a plurality of circuit connection elements and electrically coupling each circuit connection element of the plurality to the conductive trace layer;
forming a second dielectric layer over the conductive trace layer; and
forming a plurality of vias in the second dielectric layer exposing a plurality of connection areas on the conductive trace layer, the plurality of connection areas configured for receiving a plurality of semiconductor dice.

10. The method of claim 9, further comprising:
providing the plurality of semiconductor dice, each semiconductor die of the plurality having a plurality of signal connection devices; and
electrically coupling the plurality of signal connection devices of each of the plurality of semiconductor dice with the exposed plurality of connection areas on the conductive trace layer.

11. The method of claim 10, wherein electrically coupling the plurality of signal connection devices further comprises forming a metallization layer on the exposed plurality of connection areas on the conductive trace layer.

12. The method of claim 9, further comprising depositing a barrier metal layer on each of the plurality of circuit connection elements.

13. The method of claim 12, further comprising forming a plurality of conductive bumps wherein each conductive bump of the plurality is disposed on the barrier metal layer of each of the plurality of circuit connection elements.

14. The method of claim 13, wherein forming the plurality of conductive bumps further comprises forming the plurality of conductive bumps to comprise at least one of the group consisting of solder bumps, gold stud bumps, copper stud bumps, and plated alloy stud bumps.

15. The method of claim 9, further comprising singulating the substrate into a plurality of multichip packages wherein each multichip package of the plurality includes at least two semiconductor dice.

16. The method of claim 15, further comprising arranging the plurality of semiconductor dice such that the at least two semiconductor dice of each multichip package are of at least two functional varieties.

* * * * *

UNITED STATES PATENT AND TRADEMARK OFFICE
CERTIFICATE OF CORRECTION

PATENT NO.        : 7,553,697 B2
APPLICATION NO.   : 11/595067
DATED             : June 30, 2009
INVENTOR(S)       : Meow Koon Eng et al.

It is certified that error appears in the above-identified patent and that said Letters Patent is hereby corrected as shown below:

On the Title Pg, Item (75), in "Inventors", line 6, delete "Suangwu" and insert -- Shuangwu --, therefor.

Signed and Sealed this

Eighteenth Day of August, 2009

David J. Kappos
*Director of the United States Patent and Trademark Office*